United States Patent [19]

Ko

[11] Patent Number: 5,787,011
[45] Date of Patent: Jul. 28, 1998

[54] LOW-POWER DESIGN TECHNIQUES FOR HIGH-PERFORMANCE CMOS CIRCUITS

[75] Inventor: Uming Ko, Plano, Tex.

[73] Assignee: Texas Instruments Incorporated, Dallas, Tex.

[21] Appl. No.: 375,145

[22] Filed: Jan. 19, 1995

[51] Int. Cl.$^6$ .................. H01L 21/8238; H03K 19/0948
[52] U.S. Cl. .................. 364/490; 364/488
[58] Field of Search .................. 364/488, 489, 364/490, 491, 578

[56] References Cited

U.S. PATENT DOCUMENTS

| | | | |
|---|---|---|---|
| 4,698,760 | 10/1987 | Lembach et al. | 364/490 |
| 5,003,487 | 3/1991 | Drumm et al. | 364/489 |
| 5,392,221 | 2/1995 | Donath et al.a | 364/489 |
| 5,426,591 | 6/1995 | Ginetti et al. | 364/489 |
| 5,515,302 | 5/1996 | Horr et al. | 364/578 |

*Primary Examiner*—Kevin J. Teska
*Assistant Examiner*—Dan Fiul
*Attorney, Agent, or Firm*—Robert D. Marshall, Jr.; James C. Kesterson; Richard L. Donaldson

[57] ABSTRACT

A data processing circuit includes first and second signal paths, wherein the first signal path is a speed critical path. The first signal path includes a first logic gate (FIG. 22) for performing a predetermined logic operation, and the second signal path includes a second logic gate (FIG. 23) for performing the predetermined logic operation more slowly and with less power consumption than the first logic gate.

18 Claims, 11 Drawing Sheets

|  | IV110 | IV120 | IV130 | IV140 |
|---|---|---|---|---|
| $\frac{W}{L}(p)$ | $\frac{1.8}{0.6}$ | $\frac{2.6}{0.6}$ | $\frac{3.6}{0.6}$ | $\frac{5.2}{0.6}$ |
| $\frac{W}{L}(n)$ | $\frac{1.4}{0.6}$ | $\frac{2.0}{0.6}$ | $\frac{2.8}{0.6}$ | $\frac{4.0}{0.6}$ |

$P_{sc}$ VS. INPUT SLEW FOR DIFFERENT DRIVE STRENGTHS

FIG. 5

"DRIVER" $P_{sc}$ VS. FANOUT FOR DIFFERENT INPUT SLEWS

FIG. 6

OUTPUT RISE TIME VS. INPUT SLEW FOR DIFFERENT LOADS

EFFECT OF FANOUT ON $P_{sc}$ OF THE "LOAD" GATES

FIG. 10

TOTAL $P_{sc}$ VS. FANOUT FOR DIFFERENT INPUT SLEWS

FIG. 11

TOTAL $P_{sc}$ VS. FANOUT FOR VARIOUS "DRIVER" GATES

FIG. 12

TOTAL $P_{cap}$ VS. FANOUT FOR VARIOUS "DRIVER" GATES

TOTAL $P_{dynamic}(=P_{sc}+P_{cap})$ VS. FANOUT @ SLEW=1ns

*FIG. 13D*

POWER RATIO (IV140/IV110) VS. FANOUT AND SLEWS

POWER RATIO (IV120/IV110) VS. FANOUT AND SLEWS

| PARAMETERS (Vdd=3.3 V) | CPL | CPL w/ pMOS#1 | CPL w/ pMOS#2 | CPL, LOW POWER | UNITS |
|---|---|---|---|---|---|
| POWER @ 100 MHz | 97.1 | 46.8 | 45.2 | 34.5 | mW |
| PERCENTAGE | 281 | 136 | 131 | 100 | % |
| DELAY OF CRITICAL PATH | 2.09 | 2.30 | 2.37 | 2.24 | ns |
| PERCENTAGE | 100 | 110 | 113 | 107 | % |
| ENERGY @ 100 MHz | 202.9 | 107.6 | 107.1 | 77.3 | pJ |
| PERCENTAGE | 262 | 139 | 139 | 100 | % |
| AREA: TR. WIDTH | 27754.8 | 28092.2 | 28429.6 | 17437.1 | μm |
| PERCENTAGE | 159 | 161 | 163 | 100 | % |

FIG. 24

| PARAMETERS (Vdd=3.3 V) | DPL | DPL, LOW POWER | UNITS |
|---|---|---|---|
| POWER @ 100 MHz | 40.1 | 27.5 | mW |
| PERCENTAGE | 146 | 100 | % |
| DELAY OF CRITICAL PATH | 2.11 | 1.98 | ns |
| PERCENTAGE | 107 | 100 | % |
| ENERGY @ 100 MHz | 84.6 | 54.5 | pJ |
| PERCENTAGE | 155 | 100 | % |
| AREA: TOTAL TR. WIDTH | 30242 | 19116.5 | μm |
| PERCENTAGE | 158 | 100 | % |

*FIG. 25*

| PARAMETERS (Vdd=3.3 V) | STATIC | CPL, LOW POWER | DPL, LOW POWER | UNITS |
|---|---|---|---|---|
| POWER @ 100 MHz | 34.3 | 34.5 | 27.5 | mW |
| PERCENTAGE | 125 | 125 | 100 | % |
| DELAY OF CRITICAL PATH | 2.33 | 2.24 | 1.98 | ns |
| ENERGY @ 100 MHz | 79.9 | 77.3 | 54.5 | pJ |
| PERCENTAGE | 147 | 142 | 100 | % |
| AREA: pMOS TR. WIDTH | 17700 | 8295.6 | 11935.5 | μm |
| nMOS TR. WIDTH | 9655 | 9141.5 | 7181 | μm |
| TOTAL WIDTH | 27355 | 17437.1 | 19116.5 | μm |
| PERCENTAGE | 157 | 100 | 110 | % |

*FIG. 26*

| | SPEED CRITICAL PATH | OTHER PATHS |
|---|---|---|
| LOW-POWER CPL | FIG. 20 GATE(S) | FIG. 21 GATE(S) |
| LOW-POWER DPL | FIG. 22 GATE(S) | FIG. 23 GATE(S) |

LOW-POWER DESIGN TECHNIQUES FOR HIGH-PERFORMANCE CMOS CIRCUITS

FIELD OF THE INVENTION

The invention relates generally to CMOS circuit design and, more particularly, to CMOS circuit design techniques directed to reducing the total power dissipation without impairing the performance of the CMOS circuit.

BACKGROUND OF THE INVENTION

As portable electronic equipment continues its double-digit percentage growth each year while battery technology is only projected to improve by 30% over the next five years, there is a tremendous demand for low-power design solutions to bridge this technology gap. The problem is further aggravated by the fact that microprocessor on-chip clock rates are continually increasing to meet the ever increasing computation and throughput demands of applications such as the super-portable PC, Personal Digital Assistants (PDA), and personal communications services (PCS). Thus, designing a low-power processor is becoming increasingly as important as designing a high-performance processor. This trend toward processors with high performance and low power consumption will also ultimately benefit desk top systems as well as portable systems because it will permit greater integration at the silicon level with less expensive device packaging.

One exemplary component which is important in determining the throughput of a data processing device is the adder circuit, because the adder circuit is used in the execution unit, the floating-point unit and the memory address generation unit. Different CMOS circuit styles can be employed to design energy efficient, high-performance adders. Conventional static CMOS has been the technique of choice in most data processor designs. Alternatively, static pass-gate circuits have been suggested for low-power applications. Judiciously clocked dynamic circuits have also been used in low-power microprocessors.

In view of the above-described dual requirements of low power dissipation and high performance, it is desirable to provide high-performance CMOS circuits with low power dissipation and high silicon area efficiency.

The present invention provides CMOS circuits capable of high performance with low power dissipation by introducing low-power circuit elements into the non-speed critical paths of the CMOS circuit while utilizing high-performance circuit elements in the speed critical paths of the circuit.

2

DETAILED DESCRIPTION

The low-power CMOS circuit design techniques according to the present invention are disclosed herein with respect to CMOS adder circuits. However, as will become apparent from the following description, the design techniques disclosed herein are applicable to CMOS circuits in general.

In conventional carry look-ahead (CLA) adders, the propagate function determines whether or not to propagate the input carry value through the individual adder cell to become a carry output from that cell. Assuming that the adder cell has bits a and b which are to be added together by the adder cell, then the propagate function of the adder cell is obtained by exclusive-ORing a with b. If the exclusive-OR of a with b yields a result of 1, then the carry input of the adder cell is propagated through to become a carry output from that cell. If the exclusive-OR of a with b yields a 0 result, then the carry input of the adder cell is not propagated through to the carry output thereof. Thus, the exclusive-OR gate is important in the design of carry look-ahead adders and the present invention is described herein with reference to the design of exclusive-OR gates which generate the propagate function of carry look-ahead adder circuits.

Figure 18:
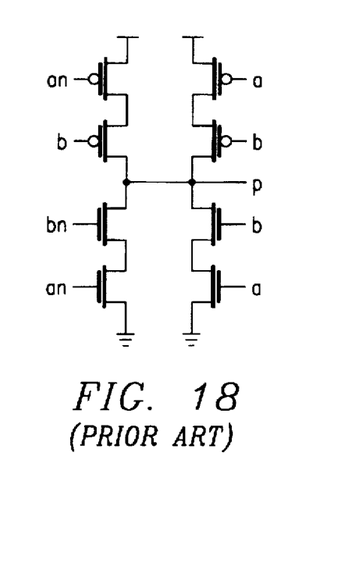
FIGS. 18 and 19 are schematic diagrams of exclusive-OR gates used in conventional adder circuits.

FIG. 18 illustrates a full static exclusive-OR gate according to the prior art, wherein the symbols a and b represent the data bits to be added by the adder cell, the symbols an and bn represent the inverses of data bits a and b, respectively, and the symbol p represents the propagate function, namely the exclusive-OR of bit a with bit b. The full static implementation of FIG. 18 is a common CMOS design practice because it involves minimum design risk. However, the serially connected nMOS transistors and the serially connected pMOS transistors tend to demand that their width be increased to obtain a reasonable conducting current to drive capacitive loads. This disadvantageously results in significant area overhead, which also causes high gate input capacitance and therefore high power dissipation.

Figure 19:
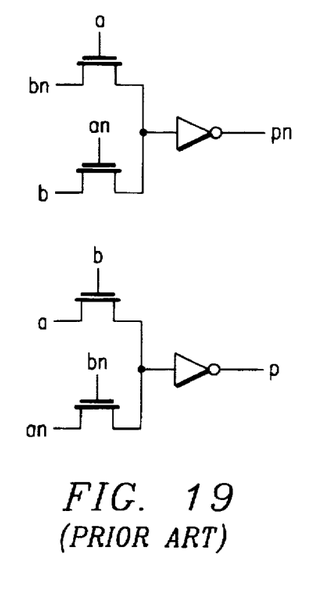

FIG. 19 illustrates a conventional complementary pass-gate logic (CPL) implementation of an exclusive-OR gate. The arrangement of FIG. 19 generates the propagate signal p using only half as many transistors as the full static gate of FIG. 18. In CPL, dual rail signals p and pn (the inverse of p) are typically generated simultaneously to minimize the propagation delay through each circuit block. However, when the inputs of the inverters of FIG. 19 are driven to a high logic level by the illustrated NMOS transistors, they are actually at $V_{dd}-V_t$, where $V_{dd}$=supply voltage and $V_t$=threshold voltage of the driving nMOS transistor, which results in an incomplete turn-off of pMOSFETs in the inverters. This results in a disadvantageously high static short-circuit current through the inverters of FIG. 19.

Figure 20:
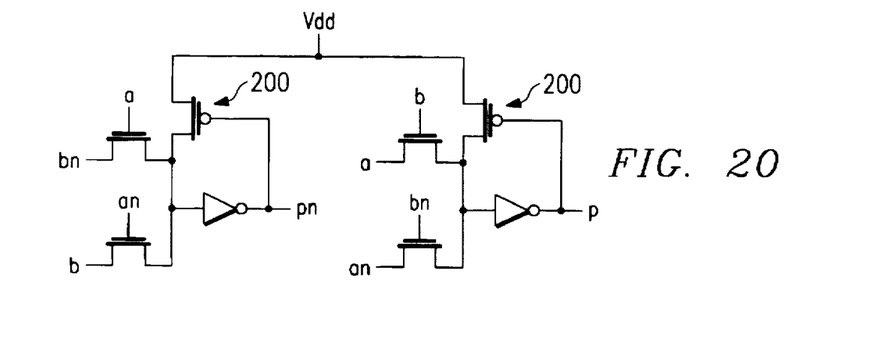
FIG. 20 is a schematic diagram of a high-performance, low-power exclusive-OR gate according to the present invention.

FIG. 20 illustrates an arrangement for minimizing the disadvantageous static short-circuit current associated with the inverters of FIG. 19. More specifically, FIG. 20 provides weak pMOS feedback transistors 200 across the respective inverters to pull the input nodes of the inverters to full $V_{dd}$. The arrangement of FIG. 20 thus avoids the static short-circuit current problem associated with the inverters of FIG. 19.

Figure 21:
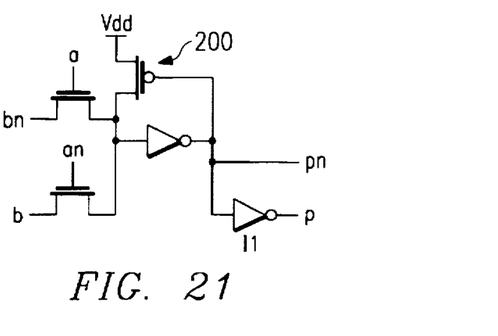
FIG. 21 is a schematic diagram of a low-power exclusive-OR gate according to the present invention.

FIG. 21 illustrates a CPL implementation of an exclusive-OR gate which provides both the propagate signal p and its inverse pn, but uses three fewer transistors than the dual rail arrangement of FIG. 20. The exclusive-OR gate of FIG. 21 will be slower than the exclusive-OR gate of FIG. 20 because of the additional delay associated with inverter I1, but will also have lower power consumption because it uses fewer transistors. Thus, the FIG. 20 design is a high-performance design as compared to FIG. 21, but FIG. 21 is a low-power design as compared to FIG. 20. The low-power arrangement of FIG. 21 may be advantageously utilized in non-speed critical paths of, for example, an adder circuit.

Figure 24:
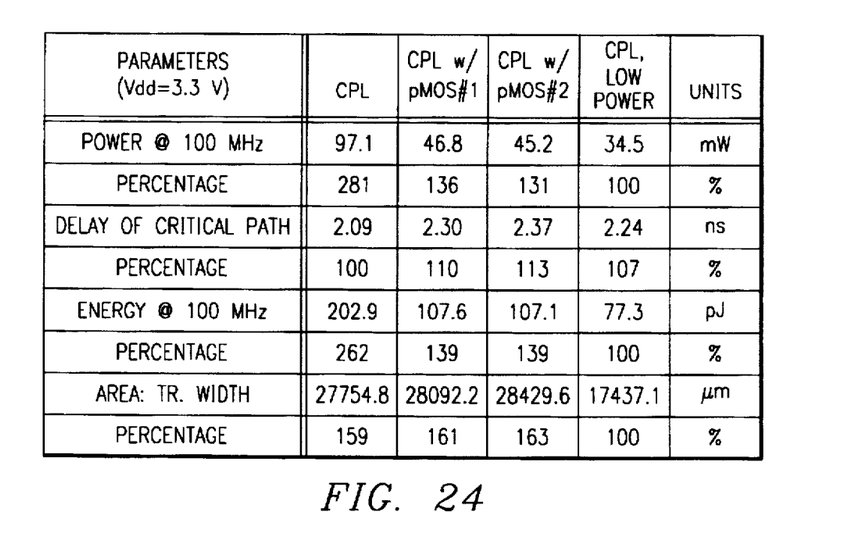
FIGS. 24–26 are tabulated comparisons between conventional adder circuits and low-power adder circuits according to the present invention, in terms of power dissipation, performance, energy consumption and silicon area.
Figure 27:
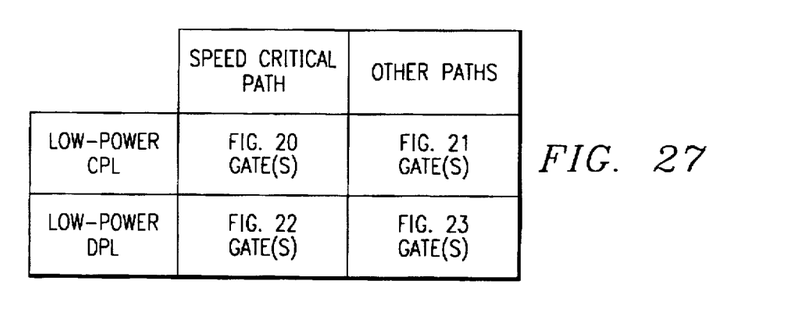
FIG. 27 shows the design technique employed to obtain the low-power CPL and low-power DPL results of FIGS. 24–26.

FIG. 24 illustrates the effect of the present invention on the design of a 32-bit carry look-ahead adder in 0.6 micron, two level metal CMOS technology. The FIG. 24 column labeled CPL contains the results obtained using the prior art dual rail CPL approach of FIG. 19, the FIG. 24 column labeled CPL with pMOS #1 shows the results obtained using the dual rail, feedback transistor approach of FIG. 20, the FIG. 24 column labeled CPL with pMOS #2 shows the results obtained using the design of FIG. 20 but with a stronger feedback pMOS transistor than in the adjacent pMOS #1 column, and the FIG. 24 column labeled low power CPL shows the results obtained using the high-performance approach of FIG. 20 (with the weaker feedback pMOS transistor) in the speed-critical path of the adder, while using the low-power arrangement of FIG. 21 in the non-speed critical paths (see FIG. 27).

As shown in FIG. 24, the arrangement of FIG. 20 with the weaker feedback transistor (pMOS #1) has a power dissipation of 48% of that in the conventional CPL arrangement of FIG. 19, at the cost of a 10% performance degradation and a 1% area overhead. The stronger feedback transistor (pMOS #2) provides further power reduction with a nominal speed penalty. However, the additional power reduction achieved by using the stronger feedback transistor is not significant. The low power CPL approach of FIG. 24, wherein the high-performance arrangement of FIG. 20 is used in the speed-critical path and the low-power arrangement of FIG. 21 is used in the non-critical paths (see FIG. 27), results in an additional power reduction of 31% beyond the CPL with pMOS #2 column. In addition to power savings, the low power CPL technique also saves 63% in area and enhances performance as compared to both the CPL with pMOS #1 and the CPL with pMOS #2 columns.

Figure 22:
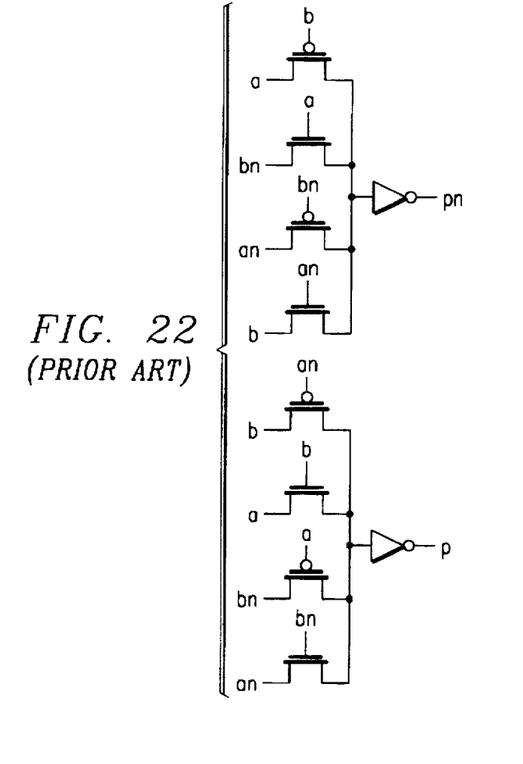
FIG. 22 is a schematic diagram of another exclusive-OR gate used in conventional adder circuits.

Referencing now FIG. 22, the conventional double pass-gate logic (DPL) exclusive-OR gate implementation shown therein avoids the series sizing problem and the high gate capacitance problem of the FIG. 18 full static implementation. The DPL approach of FIG. 22 also avoids the $V_{dd}-V_t$ voltage drop problem associated with the CPL design of FIG. 19 because the DPL design includes both pMOS and nMOS pass-gates.

Figure 23:
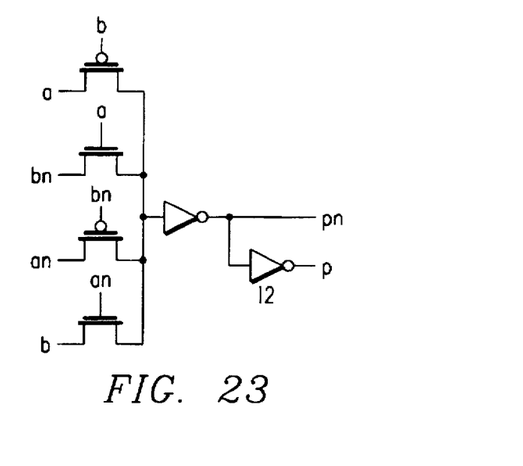
FIGS. 23 is a schematic diagram of another low-power exclusive-OR gate according to the present invention.

FIG. 23 illustrates a low-power DPL exclusive-OR gate which has four fewer transistors than the arrangement of prior art FIG. 22. The design of FIG. 23 will be slower than the dual rail design of FIG. 22 because of the additional delay introduced by inverter I2, but has lower power consumption than the design of FIG. 22 because it utilizes less transistors. Thus, the design of FIG. 22 is a high-performance design as compared to FIG. 23, but the design of FIG. 23 is a low-power design as compared to FIG. 22.

Figure 25:
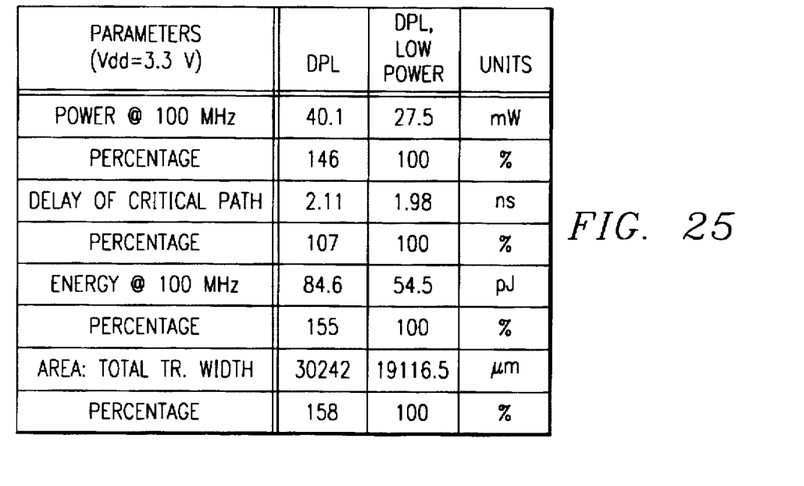

Referencing FIG. 25, the column therein labeled DPL represents a 32 bit carry look-ahead adder in 0.6 micron CMOS technology, wherein the adder is designed using the prior art dual rail technique of FIG. 22. The FIG. 25 column labeled low power DPL represents the present invention as applied to the same CMOS adder circuit, wherein the low-power design of FIG. 23 is utilized in the non-speed critical paths of the adder circuit, and wherein the high-performance arrangement of FIG. 22 is used in the speed critical path of the adder circuit (see FIG. 27). FIG. 25 reveals that, as compared to the conventional DPL design, the low-power DPL implementation of the present invention yields a 46% power reduction with a 7% speed improvement and a 58% integrated circuit area reduction.

It should be clear that the low-power gate designs should be used in lieu of the high-performance gate designs in a non-critical path only to the extent that the delay of the non-critical path does not become undesirably close to the delay of the critical path.

Figure 26:
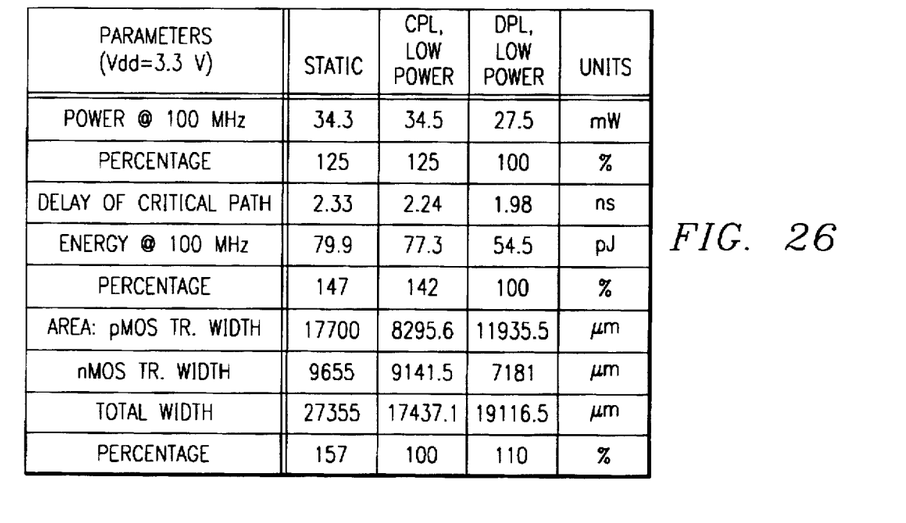

FIG. 26 compares the prior art full static design of FIG. 18 with the low power CPL column of FIG. 24 and the low power DPL column of FIG. 25. The low power DPL implementation is faster than the other two implementations primarily due to DPL's two separate current paths for charging and discharging output capacitive loads. The low-power DPL implementation is 42–47% more energy efficient than the other two implementations shown in FIG. 26. The low power DPL implementation uses substantially less silicon area than the full static implementation, but has a 10% overhead compared to the low power CPL implementation.

The results shown in the low-power CPL and low-power DPL columns of FIGS. 24–26 were obtained using the above-described techniques and also using the short circuit power optimization techniques described below with respect to FIGS. 1–17. For example, the FIG. 25 results for low-power DPL were obtained by using the design of FIG. 22 in the speed critical path and the design of FIG. 23 in non-speed critical paths, and thereafter applying to the non-speed critical paths the short circuit power optimization techniques described below with respect to FIGS. 1–17.

The present invention reconginzes that dynamic switching power consumption in microprocessor circuitry and the like increases as clock rates increase.

From its introduction, CMOS technology emerged as the one technology with extremely low static power dissipation. In a typical CMOS gate, most of the power dissipation is dynamic power dissipation associated with the switching of the gate from one logic state to the other. The dynamic power dissipation of a CMOS gate includes two components, capacitive power dissipation due to the charging and discharging of the total load capacitance at the output of the CMOS gate, and short-circuit power caused by the flow of through or shortcircuit current through the CMOS gate from the power supply to ground.

Figure 1:
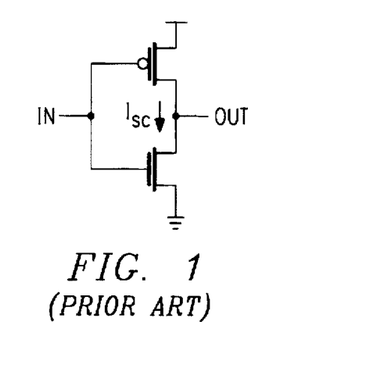
FIG. 1 illustrates a conventional CMOS inverter.
Figure 2:
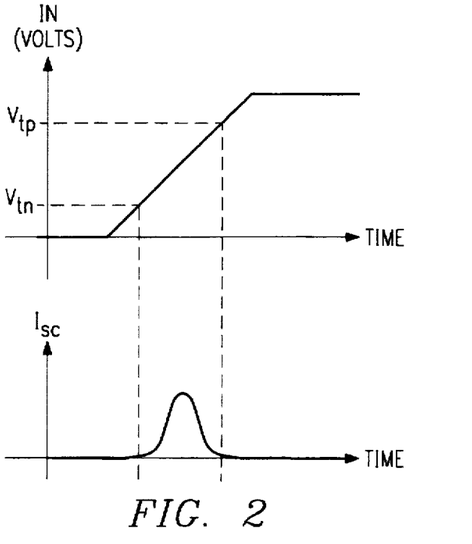
FIG. 2 is a timing diagram which illustrates short-circuit current in the CMOS inverter of FIG. 1.

FIG. 1 illustrates an exemplary CMOS inverter. As shown in FIGS. 1 and 2, when the CMOS inverter of FIG. 1 switches between its logic states, there is a time period during which both the p-MOSFET and the n-MOSFET conduct and thus create a direct path from the power supply to ground, permitting the flow of short-circuit current $I_{sc}$, thereby resulting in short-circuit power dissipation. In particular, from the point in time when the input voltage of the inverter reaches the switching threshold voltage $V_{tn}$ of the n-MOSFET until the point in time when the input voltage reaches the threshold voltage $V_{tp}$ of the p-MOSFET, both the n-MOSFET and the p-MOSFET are conductive, thus permitting the short-circuit current $I_{sc}$ to flow.

The total dynamic power dissipation of a CMOS gate depends upon a number of factors such as the load capacitance at the output of the CMOS gate, the strength of the CMOS gate, the switching speed of the CMOS gate, etc. Any low power solution involves optimization of one or more of these factors in order to minimize power dissipation.

The present invention provides a low power CMOS circuit design technique wherein the gate strength of a given CMOS gate is selected by considering its input slew and its output load conditions. The technique can be applied to the non-speed critical paths in a CMOS circuit in order to reduce overall power dissipation without sacrificing circuit throughput.

Figure 3:
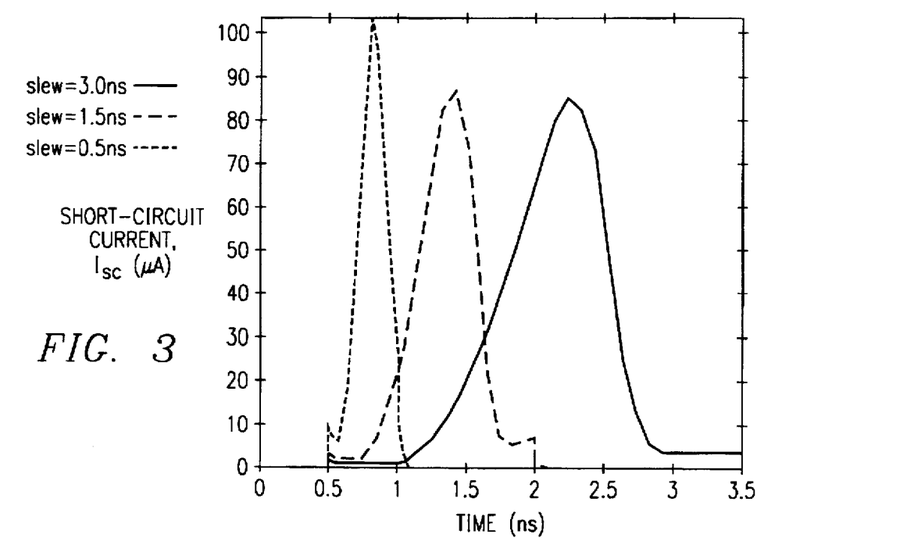
FIG. 3 graphically illustrates the effect of input slew on the short-circuit current of a CMOS inverter.

Referring again to the CMOS inverter of FIG. 1 and the short-circuit current waveform $I_{sc}$ of FIG. 2, the curves of FIG. 3 represent the short-circuit current waveform $I_{sc}$ for different input slew values, the input slew being the edge transition time of the input to the CMOS gate. As shown in FIG. 3, the waveform of the short-circuit current becomes wider timewise as the input slew increases, thus resulting in higher short-circuit power dissipation with higher input slews.

Figure 4:
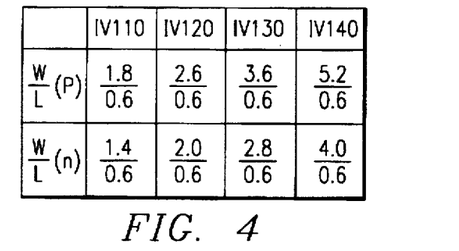
FIG. 4 is a chart showing the geometries of several different CMOS inverters used to illustrate the present invention.

FIG. 4 illustrates the channel width and channel length parameters of p-MOSFETs and n-MOSFETs included in exemplary inverters which are used herein to illustrate the present invention. The inverters are designated in FIG. 4 as IV110, IV120, IV130 and IV140. All of the inverters illustrated in FIG. 4 are fabricated according to Texas Instrument's 0.6 micron CMOS process. Inverter IV110 is the lowest drive strength gate, that is, the minimum geometry gate, and IV120, IV130 and IV140 represent proportional increases in drive strength.

Figure 5:
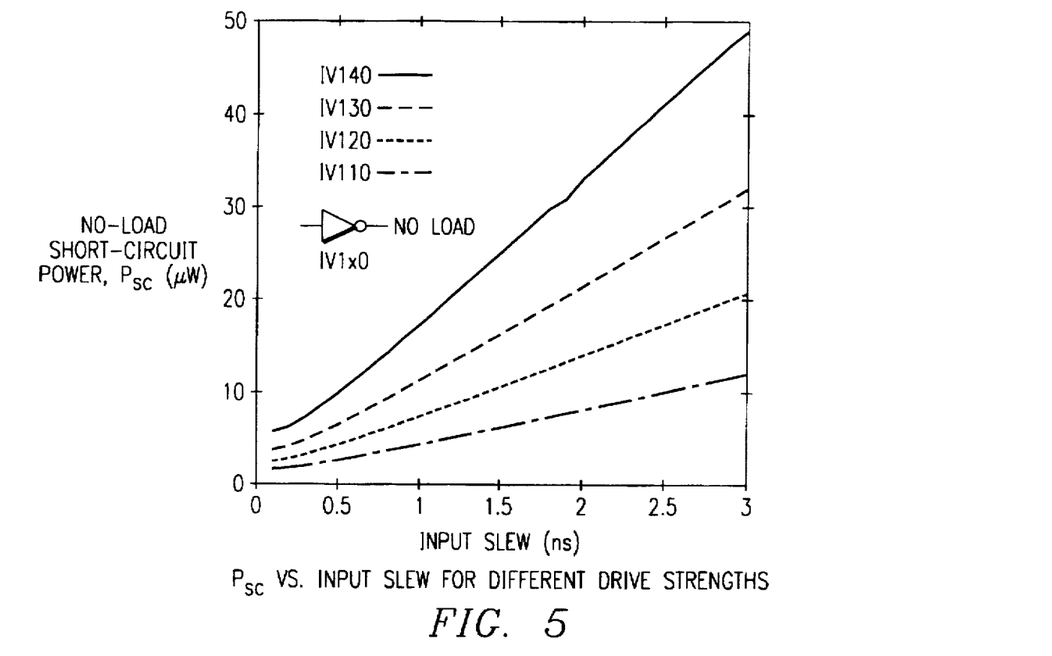
FIG. 5 is a graphical illustration of the variation of short-circuit power versus input slew for unloaded CMOS inverters of differing drive strengths.

FIG. 5 illustrates the effect of input slew on the no-load short-circuit power dissipation of the various gates of FIG. 4. The short-circuit power dissipation $P_{sc}$ increases with increasing input slew.

Considering now the case of a gate under load conditions, for a given technology the fanout of a given driving gate can be defined in terms of a standard load, for example the load offered by a single minimum geometry (lowest drive strength) inverter in that technology. Inverter IV110 is defined as the standard load for purposes of specifying fanout herein.

Figure 6:
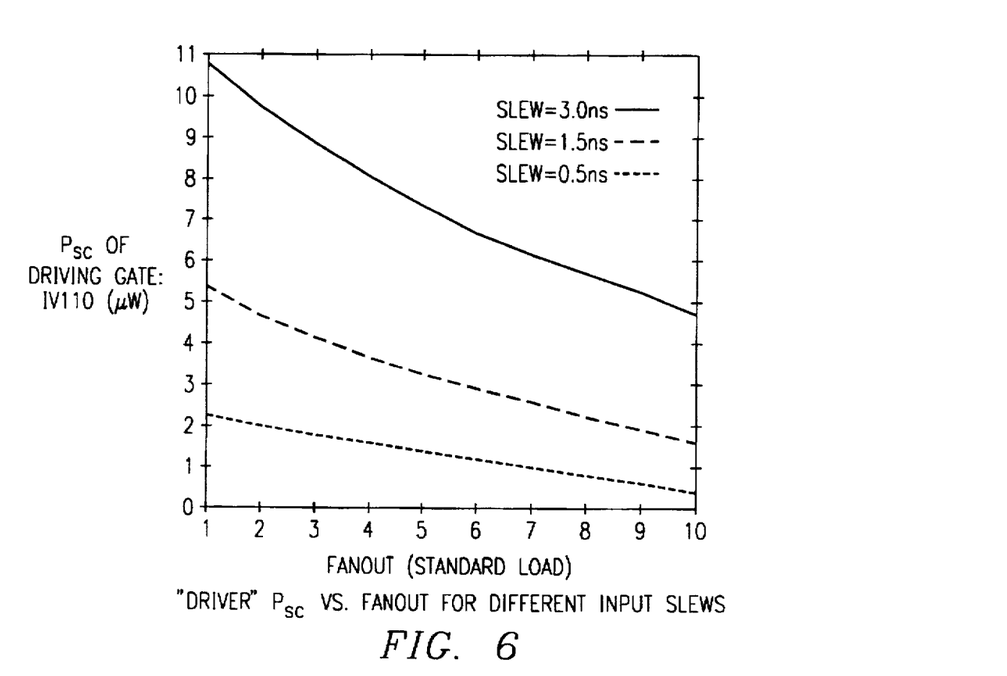
FIG. 6 graphically illustrates the variation of the short-circuit power dissipation of a CMOS inverter versus the fanout of the CMOS inverter for differing input slews.
Figure 7:
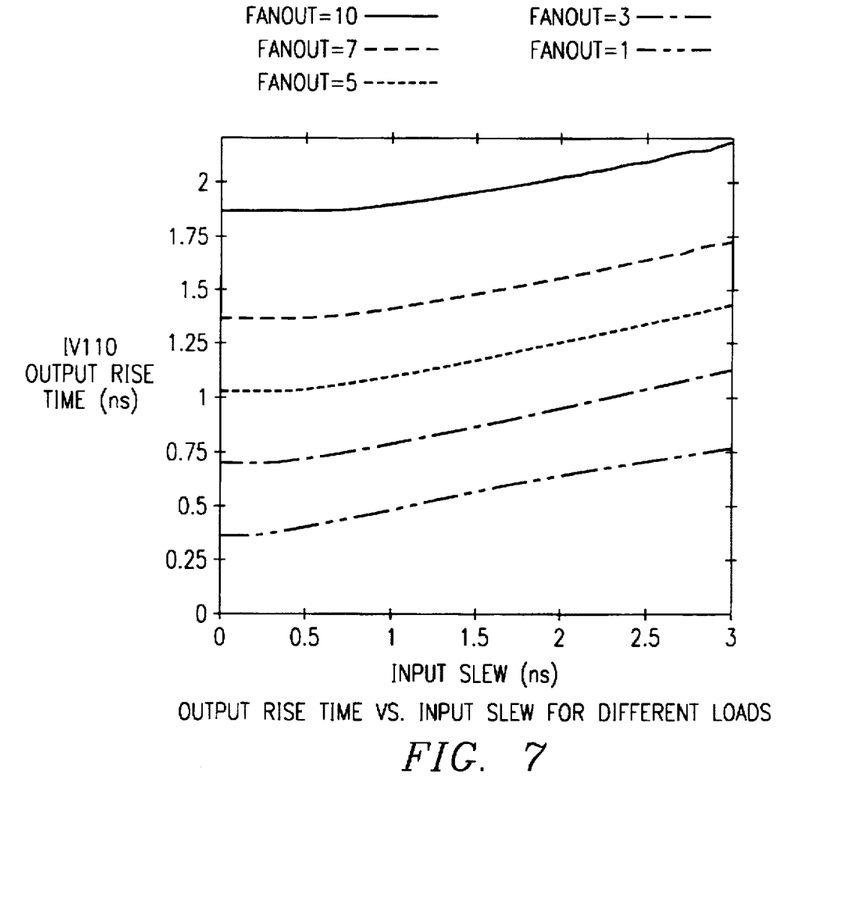
FIG. 7 illustrates the variation of output rise-time of a CMOS inverter versus input slew for different loads.

FIG. 6 illustrates that the short-circuit power of an IV110 inverter decreases as the fanout (measured in standard loads) driven by that inverter increases. For example, if the inverter IV110 is driven by an input signal having a 0.5 ns slew time, then the short-circuit power of the inverter IV110 is approximately 2 uW when the IV110 is driving two standard loads, and is approximately 1 uW when the IV110 is driving eight standard loads. As the fanout of a given gate increases, its load capacitance increases correspondingly, leading to an increase in the output rise and fall times of that gate. FIG. 7 illustrates the effect of fanout and input signal slew on the output rise time of an IV110 inverter gate. The worst case of output rise time (or output slew) is likely to occur in the NOR type implementation wherein stacked p-channel transistors are used.

Figure 8:
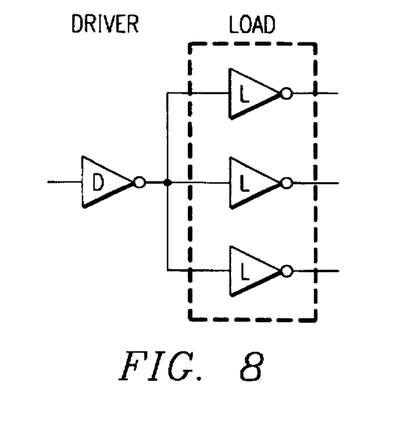
FIG. 8 illustrates one example of the loading of a CMOS inverter.

FIG. 8 illustrates the situation contemplated in FIGS. 6 and 7 wherein a driver inverter D drives a load including one or more load inverters L. As indicated above, for ease of description, each of the load inverters L is herein assumed to be an IV110 so that the load or fanout can be characterized as an integral multiple of standard loads. In conventional analysis of the dynamic power dissipated by the driver gate D of FIG. 8, the load gates L of FIG. 8 are replaced by an equivalent load capacitance $C_L$ as shown in FIG. 9.

Figure 9:
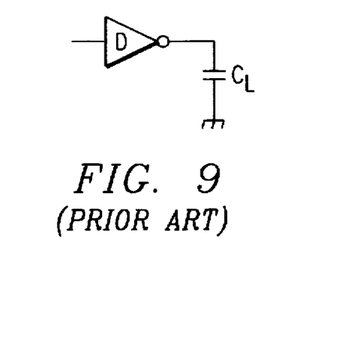
FIG. 9 illustrates how the load circuitry of FIG. 8 is conventionally modeled for purposes of analyzing power dissipation of the driving inverter of FIG. 8.

Using the conventional approach of FIG. 9 wherein the load gates L of FIG. 8 are replaced by their equivalent capacitance $C_L$ on the output of driver gate D, then the short-circuit power dissipated by driver gate D is as shown in FIG. 6. However, because the output slew of driver gate D increases as the load increases (see FIG. 7), the present invention recognizes from FIGS. 3 and 7 that the short-circuit power in each load gate L of FIG. 8 should also increase as the number of load gates L increases.

Figure 10:
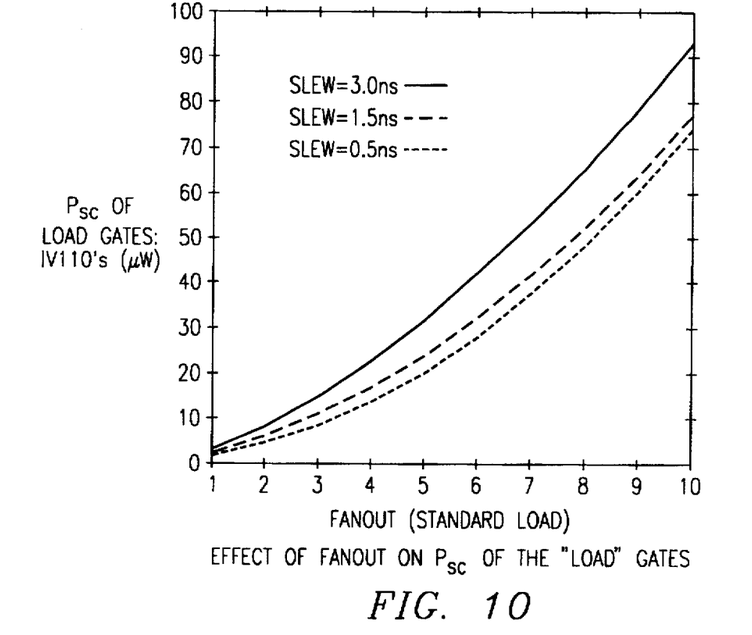
FIG. 10 graphically illustrates how the total short-circuit power dissipated in all of the load gates of FIG. 8 varies with the number of load gates.
Figure 11:
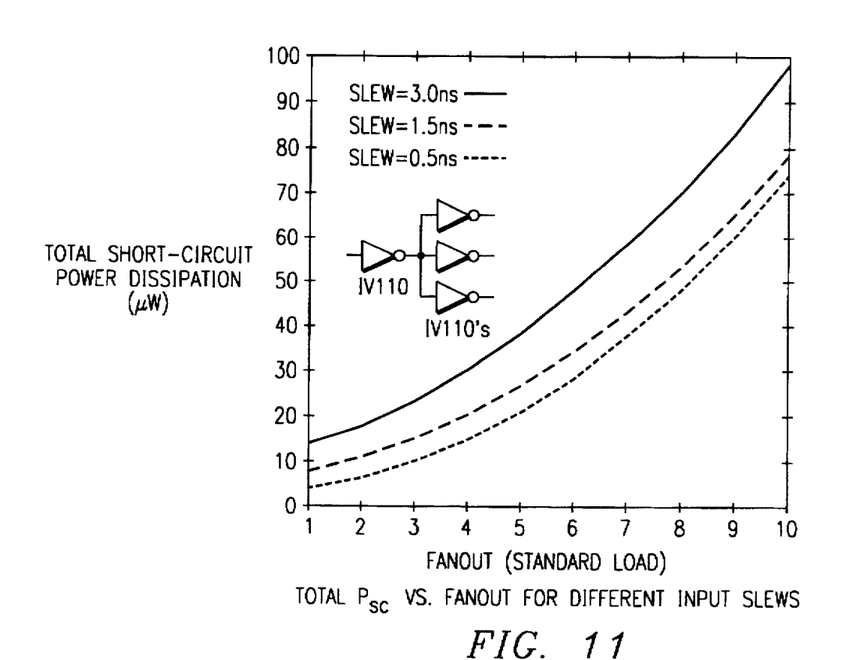
FIG. 11 graphically illustrates how the total short-circuit power dissipation of all gates in FIG. 8 varies with the number of load gates.

FIG. 10 illustrates the behavior of total short-circuit power dissipated in all of the load gates L as the fanout (the number of load gates) of driver gate D is increased, assuming driver gate D is an IV110 inverter. The behavior of short-circuit power for the load gates L is opposite to that of the driver gate D shown in FIG. 6. Considering the 3.0 ns slew line of FIG. 10, for a fanout of two standard loads, the total short-circuit power of the load gates is under 10 uW. However, for a fanout of six standard loads in FIG. 10, the total short-circuit power of the load gates is over 40 uW. The short-circuit power of the driver gate D from FIG. 6 and the short-circuit power of the load gates L from FIG. 10 are added together in FIG. 11 to illustrate the relationship between fanout and the total short-circuit power dissipated in the driver gate D and load gates L, again assuming that the driver gate D and load gates L are all IV110 inverters.

In view of the foregoing discussion of FIGS. 3, 7, 10 and 11, the present invention recognizes that a low power solution for CMOS circuit designs should preferably consider the driving gate D along with its load gates L, rather than the prior art approach of FIG. 9 wherein the driving gate D is considered along with an equivalent capacitance $C_L$ at its output.

Figure 12:
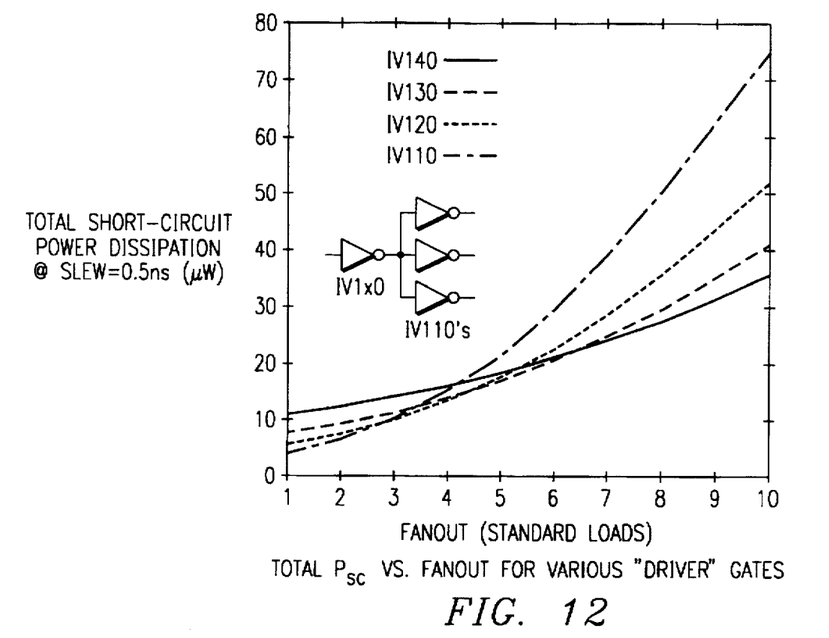
FIG. 12 graphically illustrates, for various driver gates, how the total short-circuit power dissipation of all gates in FIG. 8 varies with the fanout of FIG. 8.

FIG. 12 illustrates the behavior of the total short-circuit power dissipation of FIG. 8 for different gate strengths of the driver gate D when the output fanout is varied and the input slew is 0.5 ns. The crossover of the curves in FIG. 12 should be noted. The results for different strengths of drive gate D at heavy load conditions are opposite to that at light load conditions. That is, a driver strength which results in the lowest total short-circuit power under low fanout conditions results in the highest total short-circuit power under high fanout conditions. For example, for low fanouts (less than four standard loads), the total short-circuit power using an IV110 driver is less than the total short-circuit power using an IV140 driver, because the IV140 driver consumes more short-circuit power due to its high drive strength relative to the IV110 driver. As the fanout is increased beyond four standard loads, the output slew of the IV110 driver deteriorates considerably (see again FIG. 7), while the stronger IV140 drive gate has a lower output slew than the IV110 drive gate. The lower output slew of the IV140 drive gate results in lower short-circuit power dissipation in the load gates L in comparison to when the IV110 is used. As FIG. 12 illustrates, when the load in FIG. 8 increases beyond four standard loads, the reduced short-circuit power in the load gates achieved by the smaller output slew of the IV140 driver more than offsets the increased short-circuit power in the IV140 drive gate itself. Thus, for fanouts above four standard loads, the IV140 driver provides lower total short-circuit power dissipation than the IV110.

As previously indicated, a stronger drive gate such as the IV140 will have a higher short-circuit current, and thus a higher short-circuit power dissipation, than a weaker drive gate such as the IV110. As illustrated in FIG. 3, the longer the input slew rate, the longer the duration of the higher short-circuit current associated with the WV140 relative to the IV1 10. Noting that the curves of FIG. 12 were obtained with an input slew of 0.5 ns at the input of the driver gate, the crossover point of FIG. 12 will vary as the input slew varies. For example, if the input slew is 2 ns rather than 0.5 ns, then the increase in short circuit power in driver IV140 due to the increased slew will be greater than the increase in short-circuit power in driver gate IV110 due to the increased slew, thus forcing the IV110/IV140 crossover point further to the right in FIG. 12.

Figure 13A:
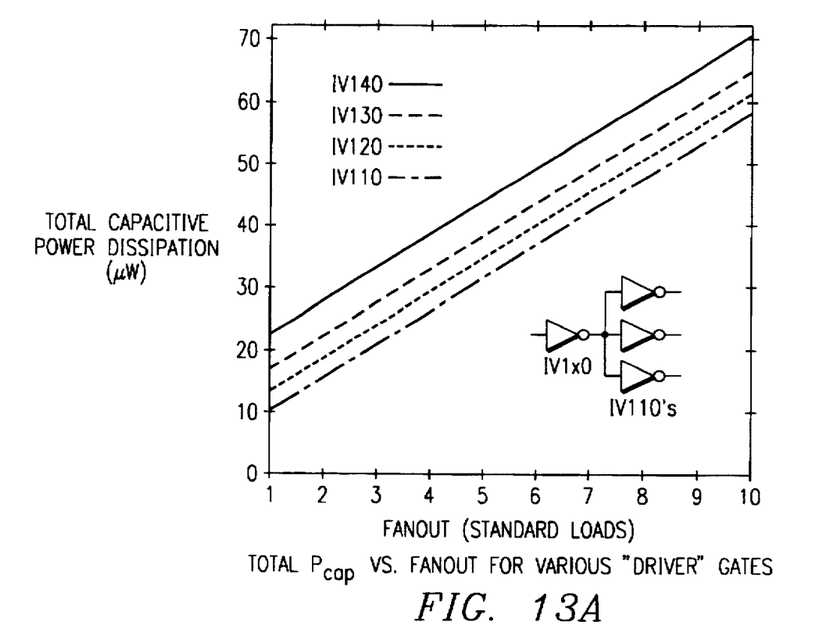
FIG. 13A graphically illustrates, for various driver gates, how the total capacitive power dissipation of the FIG. 8 arrangement varies with the fanout of FIG. 8.

FIG. 13A illustrates, for various driver gate strengths, how the total capacitive power dissipation (PCAp) of the FIG. 8 arrangement varies with the fanout of FIG. 8, assuming a switching rate of 100 MHz. The total capacitive power dissipation of FIG. 13A is proportional to fanout and driver gate strength.

Figure 13B:
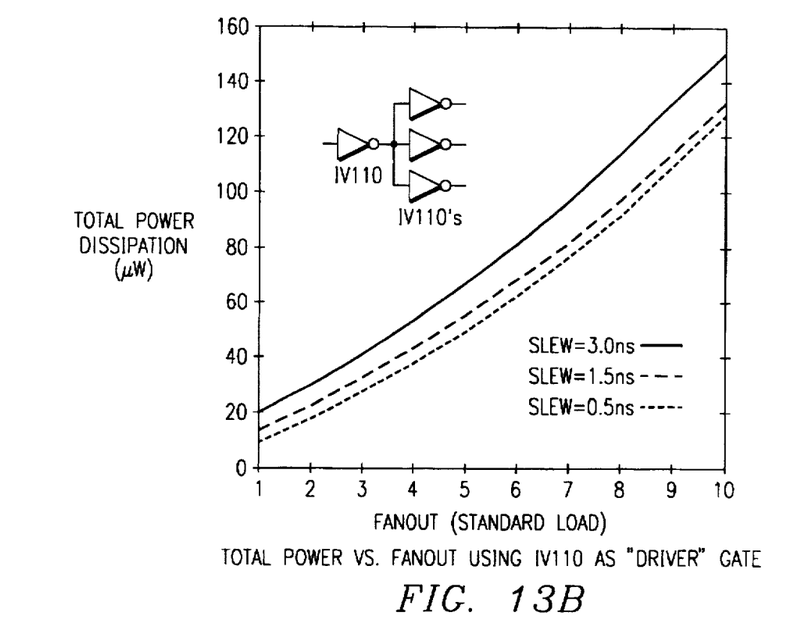
FIG. 13B graphically illustrates how the total dynamic power dissipation of the FIG. 8 arrangement varies with the load of FIG. 8.
Figure 13C:
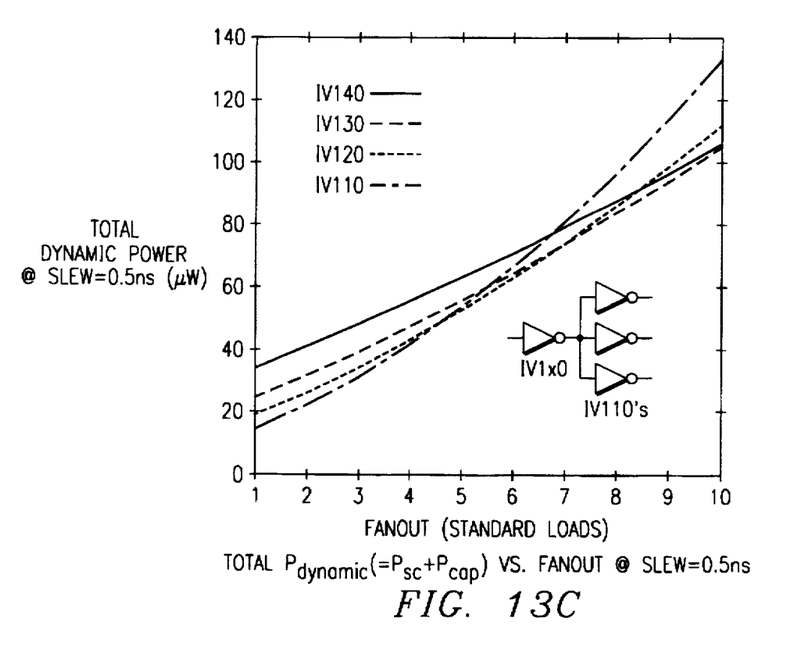
FIGS. 13C and 13D graphically illustrate, for various driver gates and slews, how the total dynamic power dissipation of the FIG. 8 arrangement varies with the fanout of FIG. 8.
Figure 13D:
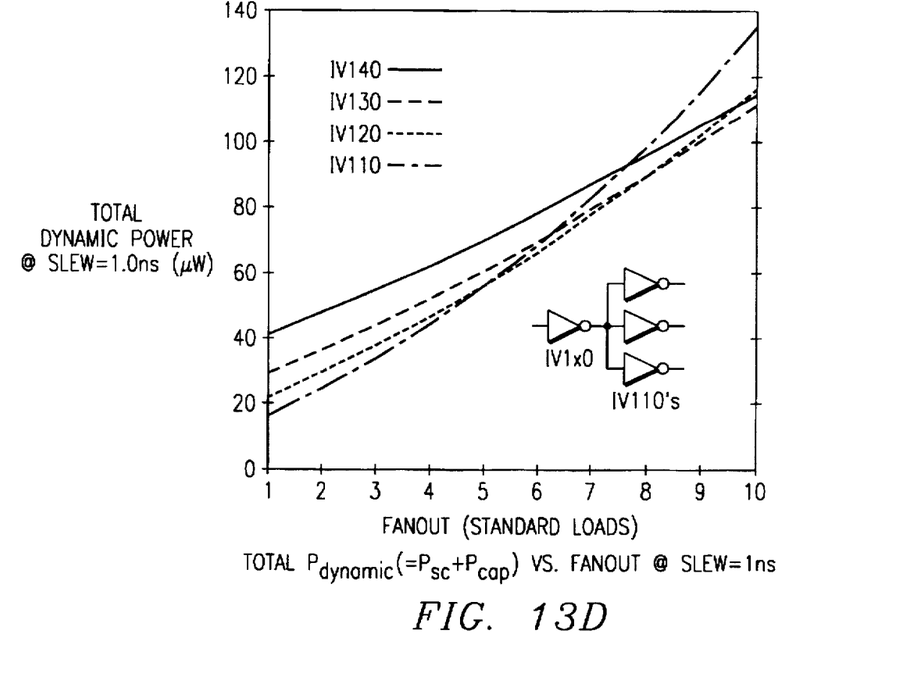

FIG. 13B illustrates the relationship between fanout and the total dynamic power dissipation in FIG. 8, assuming a 100 MHz switching rate and an IV110 driver gate. FIG. 13B thus represents in effect a summing of FIG. 11 with the capacitive power dissipation represented by the IV110 curve of FIG. 13A FIGS. 13C and 13D illustrate the relationship between fanout and total dynamic power dissipation in the arrangement of FIG. 8 for various driver gate strengths at slews of 0.5 ns (FIG. 13C) and 1 ns (FIG. 13D) and assuming a 100 MHz switching rate. The crossover region of the total dynamic power dissipation curves of FIGS. 13C and 13D is shifted rightwardly relative to the crossover region of the total short circuit power dissipation curves of FIG. 12 due to the capacitive power dissipation component ($P_{CAP}$) of the total dynamic power dissipation curves of FIGS. 13C and 13D.

Figure 14:
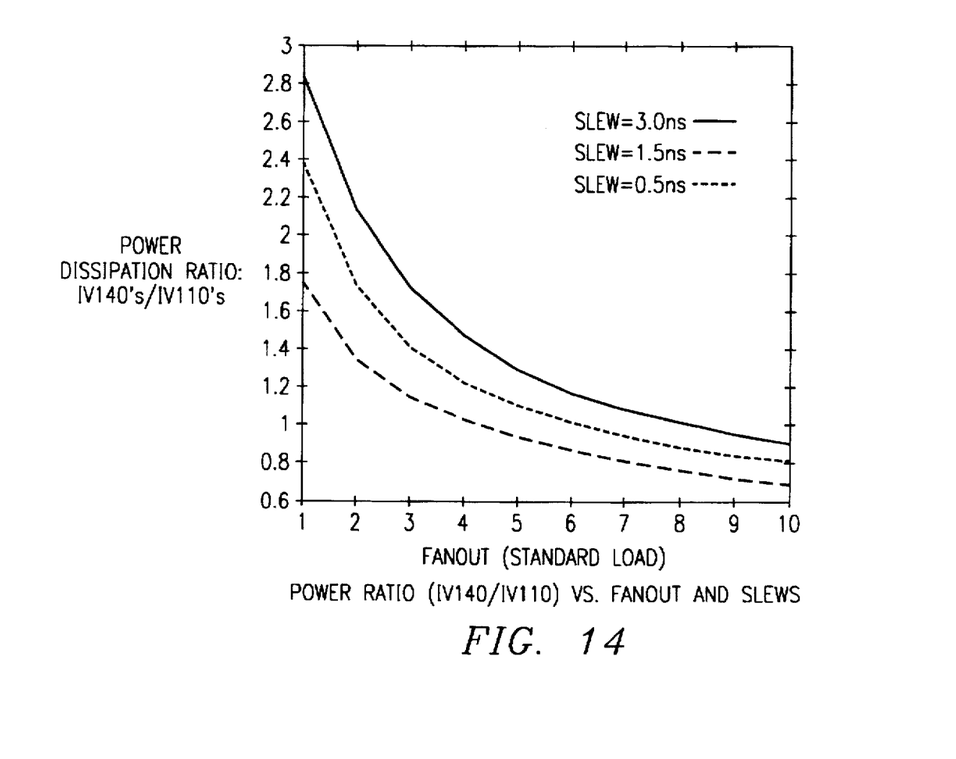
FIG. 14 graphically illustrates how the ratio of total power dissipated using a first driver inverter in FIG. 8 to total power dissipated using a second driver inverter in FIG. 8 varies with the fanout of FIG. 8.
Figure 15:
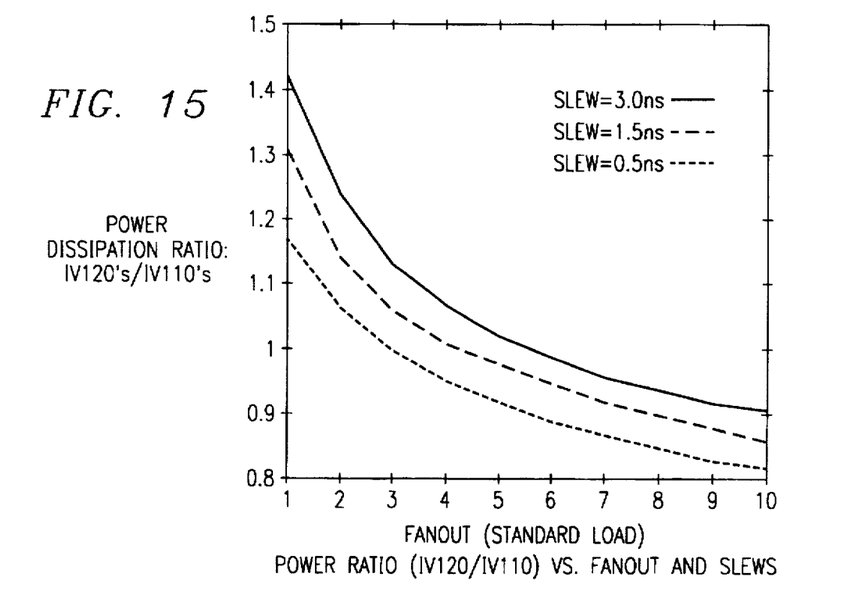
FIG. 15 is similar to FIG. 14 except the power ratio illustrated is obtained using a different pair of driver inverters.

FIG. 14 compares the total power dissipation obtained using an IV140 driver to the total power dissipation obtained using an IV110 driver. More specifically, FIG. 14 plots the ratio of total power dissipation using an IV140 driver to total power dissipation using an IV110 driver, under different input slew and output fanout conditions. FIG. 15 similarly compares the total power dissipation obtained using an IV120 driver and an IV110 driver. Using FIGS. 14 and 15, the drive gate which yields the lowest total power dissipation under given input slew and fanout conditions can be determined. For example, FIG. 14 indicates that for an input slew of 0.5 ns and a fanout of two standard loads, the power dissipation ratio of the IV140 to the IV110 is nearly 1.4, thus indicating that the IV110 will yield the lowest power dissipation in the arrangement of FIG. 8. However, with the same input slew but a fanout of five standard loads, the ratio of FIG. 14 is less than 1, indicating that the IV140 driver yields the lowest power dissipation. Similarly in FIG. 15, an input slew of 3 ns and a fanout of two standard loads indicates that the IV110 provides the lowest power dissipation, while a fanout of seven standard loads with an input slew of 3 ns indicates that an IV120 is preferable to the IV110 for minimizing power dissipation.

For any given technology, a table of appropriate drive strengths based on input slew and output fanout can be developed for each cell in the library in the manner illustrated in FIGS. 14 and 15. These tables can then be used by any automated optimization tool to reduce power dissipation by appropriate choice of drive gate strength. The larger the available selection of drive gate strengths for each cell, the better the result will be in terms of power reduction.

Data such as that shown in FIGS. 14 and 15 can be used to select the drive gate strengths in all non-speed critical paths of a given CMOS circuit design. The drive gate strength is selected according to data such as illustrated in FIGS. 14 and 15, as a function of the output load and input slew conditions that the drive gate will see. The selection of drive gates will typically work from output stages of the CMOS circuit backward toward the inputs, because primary output loads are generally dictated by the system environment in which the CMOS circuit is used. However, as will be apparent from the following description, the selection could also proceed from input stages forward.

Figure 16:
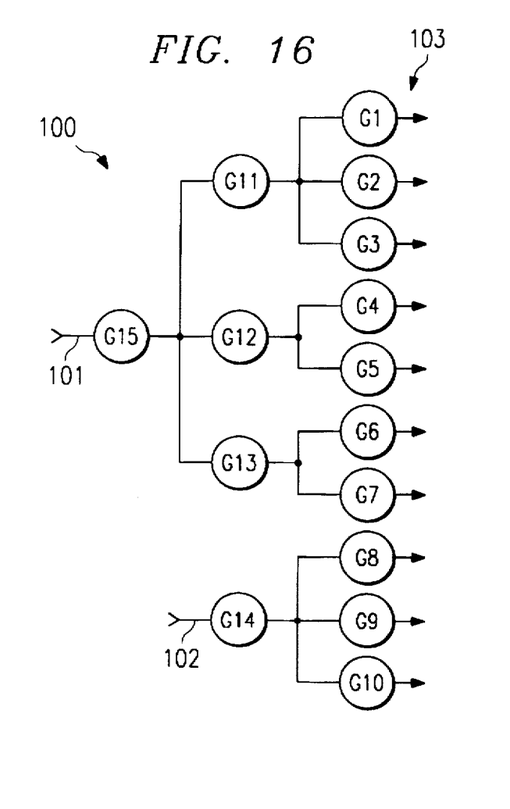
FIG. 16 illustrates an exemplary CMOS circuit to which the present invention is applicable.

FIG. 16 illustrates at 100 several exemplary signal paths in a CMOS circuit module. The signal paths at 100 are driven by inputs 101 and 102 and produce a plurality of outputs at 103. The inputs 101 and 102 are typically received from a circuit module upstream from the signal paths of FIG. 16, and the outputs at 103 drive the inputs of another circuit module downstream from the FIG. 16 signal paths. The signal paths of FIG. 16 include CMOS gates G1–G15, and are all assumed, for purposes of example, to be non-speed critical signal paths. The gates G1–G15 of the exemplary signal paths are analyzed according to the present invention as follows.

The input slew of the signals 101 and 102 will be the known output slew of the circuit module upstream from FIG.

16, and the loads driven by each of the outputs 103 will be defined by the known inputs of the circuit module being driven by outputs 103. It is initially assumed that each of gates G1–G15 is the minimum geometry (and hence minimum drive strength) gate available for the desired function. For example, if gate G11 is an inverter, then it is assumed that gate G11 is the minimum geometry inverter available, such as an IV110 as described above. Similarly, if gate G12 is a NAND gate, then it is assumed that gate G12 is the minimum geometry NAND gate available. Because the geometry and drive strength of each gate is assumed, the load (as a multiple of a known standard load) presented by the input of each gate is also known. Because the input load presented by each gate is known, and because the input slews of signals 101 and 102 are also known, the input slew at each of gates G1–G13 is easily determined using curves such as those shown in FIG. 7. For example, if the input slew of signal 101 at the input of G15 is 0.5 ns, and if gates G11–G13 each present one standard load, then FIG. 7 indicates that the output rise time of gate G15, which is also the input slew for gates G11–G13, is approximately 0.75 ns. Repeated application of this technique permits determination of the input slew for each gate of FIG. 16.

Once the input slews of gates G1–G13 have been determined, then the techniques described above with respect to FIGS. 14 and 15 can be applied to determine the appropriate drive strength for gates G1–G13. More specifically, for each of gates G1–G10, the appropriate drive strength of the gate is determined by considering its input slew and the load presented to the output of the respective gate. In this instance, the load presented to the output of each gate G1–G10 is known from the design of the downstream circuit module driven by FIG. 16. After the drive strength for each of gates G1–G10 is determined, then the drive strength of gate G11 is determined based upon its input slew and the load presented by gates G1–G3, the drive strength of gate G12 is determined based upon its input slew and the load presented by gates G4 and G5, the drive strength of gate G13 is determined based upon its input slew and the load presented by gates G6 and G7, and the drive strength of gate G14 is determined based upon its input slew and the load presented by gates G8–G10. Once the drive strengths of gates G11–G13 have been determined, then the drive strength of gate G15 can be determined based upon its input slew and the load presented by gates G11–G13.

It should be noted from the above description that the initial assumption of minimum geometry (low drive strength) gates is only an assumption of convenience and, although some drive strength must be attributed to each gate in order to begin applying the technique of the present invention, the above-described assumption of minimum geometry gates is not required by the present invention. For example, the initial drive strengths of gates G1–G15 could alternatively be selected so as to optimize the performance of FIG. 16.

One major constraint, which may also be used as a criterion to terminate the low power optimization procedure, is to monitor, during the process of selecting the driver gates, the delay of all the non-speed critical paths to which the technique is applied and ensure that the delay obtained using the selected driver gate does not exceed the applicable design constraint, that is, does not exceed the delay of the speed-critical path of the module. In this manner, the power dissipation of the CMOS circuit can be reduced without degrading its performance.

It is noted that the data of FIGS. 14–15 can be utilized in the form of tables or mathematical equations as well as the graphical form presented in FIGS. 14–15.

Figure 17:
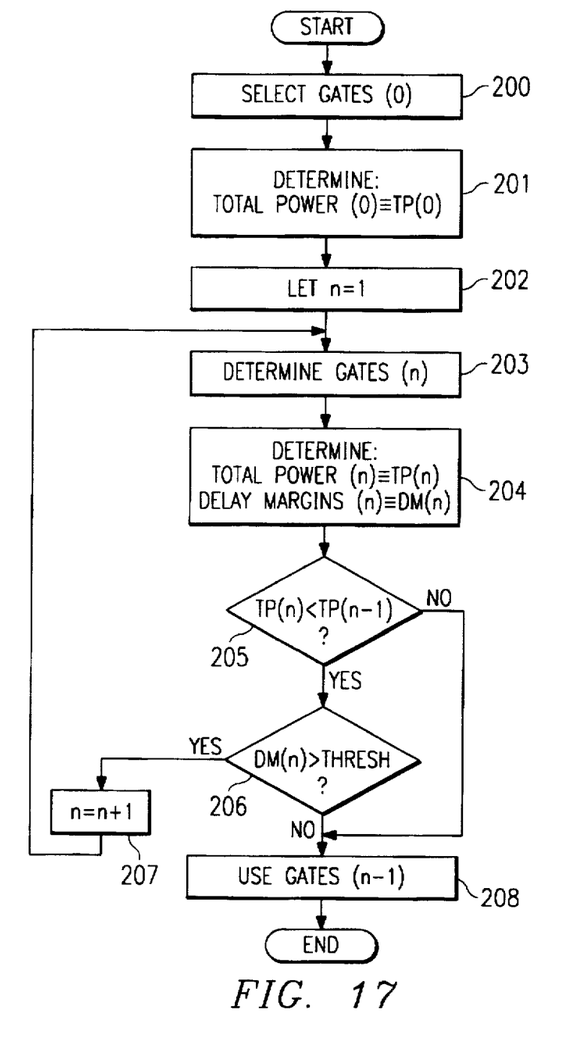
FIG. 17 is a flow chart which illustrates an exemplary design approach according to the present invention.

FIG. 17 illustrates an exemplary CMOS circuit design technique which incorporates the above-described features of the present invention. At step 200 in FIG. 17, the initial gates of the circuit are selected and designated as gates(0). The gates(0) may all be minimum geometry gates as described above. However, it should be clear that the gates (0) must provide the desired functionality of the CMOS circuit. In this connection, it is noted that, in some instances, a minimum geometry gate may have inadequate drive strength to drive the required load. In such case, that particular gate could be, for example, the minimum drive strength gate capable of adequately driving the required load. Of course, and as indicated above, gates(0) need not necessarily be minimum drive strength gates at all. For example, gates(0) could alternatively be selected so as to optimize the performance of the CMOS circuit.

After the initial gates, gates(0), have been selected in step 200, the total power dissipation associated with gates(0) is determined in step 201 and designated as TP(0).

After the initial total power TP(0) has been determined in step 201, a counter variable n is set to 1 in step 202. Thereafter, in step 203, the technique described above with reference to FIGS. 14 and 15 is employed to replace gates(0) of the CMOS circuit as appropriate. Because one or more of the initial gates(0) are replaced in step 203, the gates of the CMOS circuit are designated as gates(n) in and after step 203. Thus, after the first execution of step 203 (with n=1), the gates of the CMOS circuit would be designated as gates(1). After gates(0) have been replaced as necessary to arrive at gates(1) in step 203, the total power dissipated by gates(1) is determined in step 204 and designated as TP(1). Also in step 204, the delay margins of the non-speed critical paths of the CMOS circuit defined by gates(1) are determined and collectively designated as DM(1). The delay margin of a given a non-speed critical path is the difference between the delay of that non-speed critical path and the delay of the speed critical path of the CMOS circuit. For example, if the delay of the speed critical path is 10 ns and the delay of a given non-speed critical path is 7 ns, then the delay margin associated with that given non-speed critical path is 10−7=3 ns. After step 204, step 205 determines whether TP(1) is less than TP(0). If no, then gates(0) are selected for the design at 208. If yes at step 205, then step 206 determines whether all delay margins represented by DM(1) are greater than a predetermined threshold delay margin value. If no at 206, then gates(0) are selected for the design at 208.

If yes at 206, then step 207 increments the counter variable n from 1 to 2. Tereafter, the technique described above with respect to FIGS. 14 and 15 is applied to gates(1) at step 203 to thereby determine gates(2). Thereafter, at step 204, the total power and delay margins associated with the newly determined gates(2) are determined. Step 205 then determines whether the total power associated with gates(2) is less than the total power associated with gates(1). If no, then gates(1) are selected for the design at 208. If yes at 205, then step 206 determines whether all of the delay margins associated with gates(2) are greater than the predetermined threshold value. If no at 206, then gates(1) are selected for the design at 208. If yes at 206, then the counter variable n is incremented from 2 to 3 at 207, and the process returns again to step 203 to generate gates(3).

Steps 203–207 are sequentially executed and repeated until either step 205 or step 206 yields a result of no, whereupon the process is halted with gates(n-1) selected for the design at 208.

As noted above, the technique of FIGS. 14 and 15 is applied only to non-speed critical paths, and is not applied to speed critical paths.

The above-described technique for selecting drive gate strength may also result in a reduction in circuit area. As with any other circuit optimization method, results achieved by the above-described selection technique also depend upon the structure or characteristics of the original circuit. Circuits with a high percentage of non-speed critical paths will achieve better results than those with a low percentage. The reduction in the integrated circuit area will depend upon the load conditions in the circuit. For example, light load conditions tend to lean toward drive gates with low drive strengths, which occupy less silicon area that high drive strength gates.

The above-described drive gate replacement technique has been implemented in a CMOS 32 bit carry look ahead adder circuit with results of 28% power reduction and 41% integrated circuit area reduction.

The present invention permits reduction of dynamic power consumption in logic by manually or automatically replacing drive gates with either higher or lower drive strength gates. This provides a trade-off of power consumption against timing performance and area overheads without extensively running SPICE type circuit simulations. The invention reduces dynamic power dissipation and tends to reduce silicon area, without sacrificing critical path performance. The techniques of the invention can be readily incorporated into any power optimization or synthesis tool.

Although exemplary embodiments of the present invention are described above, this does not limit the scope of the invention, which can be practiced in a variety of embodiments.

What I claimed is:

1. CMOS data processing circuitry, comprising:
   first and second signal paths, wherein said first signal path is a speed critical path of said data processing circuitry,
   said first signal path including a first logic gate for performing a predetermined logic operation, said first logic gate having a first transistor-level logic gate structure; and
   said second signal path including a second logic gate for performing said predetermined logic operation more slowly and with less power consumption than said first logic gate, said second logic gate having a second transistor-level logic gate structure which differs from said first transistor-level logic gate structure.

2. A method of constructing a CMOS data processing circuit having first and second signal paths and wherein the first signal path is a speed critical path of the data processing circuit, comprising the steps of:

providing in the first signal path a first logic gate which performs a predetermined logic operation and which has a first transistor-level logic gate structure; and providing in the second signal path a second logic gate which performs said predetermined logic operation more slowly and with less power consumption than the first logic gate and which has a second transistor-level logic gate structure that differs from the first transistor-level logic gate structure.

3. The data processing circuitry of claim 1, wherein said second transistor-level logic gate structure includes fewer transistors than does said first transistor-level logic gate structure.

4. The data processing circuitry of claim 1, wherein said first and second logic gates include complementary pass-gate logic.

5. The data processing circuitry of claim 1, wherein said first and second logic gates include double pass-gate logic.

6. The data processing circuitry of claim 1, wherein said predetermined logic operation is an exclusive-OR operation.

7. The data processing circuitry of claim 6, wherein said second transistor-level logic gate structure includes fewer transistors than said first transistor-level logic gate structure.

8. The data processing circuitry of claim 6, wherein said first and second logic gates include complementary pass-gate logic.

9. The data processing circuitry of claim 6, wherein said first and second logic gates include double pass-gate logic.

10. The data processing circuitry of claim 1, wherein said data processing circuitry is an adder circuit.

11. The method of claim 2, wherein said second transistor-level logic gate structure includes fewer transistors than does said first transistor-level logic gate structure.

12. The method of claim 2, wherein said first and second logic gates include complementary pass-gate logic.

13. The method of claim 2, wherein said first and second logic gates include double pass-gate logic.

14. The method of claim 2, wherein said predetermined logic operation is an exclusive-OR operation.

15. The method of claim 14, wherein said second transistor-level logic gate structure includes fewer transistors than said first transistor-level logic gate structure.

16. The method of claim 14, wherein said first and second logic gates include complementary pass-gate logic.

17. The method of claim 14, wherein said first and second logic gates include double pass-gate logic.

18. The method of claim 2, wherein said data processing circuitry is an adder circuit.

* * * * *